(12) United States Patent
Nakayama et al.

(10) Patent No.: US 7,423,274 B2
(45) Date of Patent: Sep. 9, 2008

(54) ELECTRON BEAM WRITING SYSTEM AND ELECTRON BEAM WRITING METHOD

(75) Inventors: Yoshinori Nakayama, Sayama (JP); Hiroya Ohta, Kodaira (JP); Makoto Sakakibara, Kokubunji (JP); Yasunari Sohda, Kawasaki (JP); Masaki Hosoda, Saitama (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 226 days.

(21) Appl. No.: 11/355,952

(22) Filed: Feb. 17, 2006

(65) Prior Publication Data

US 2006/0197453 A1 Sep. 7, 2006

(30) Foreign Application Priority Data

Mar. 1, 2005 (JP) ............................ 2005-055592

(51) Int. Cl.
*A61N 5/00* (2006.01)

(52) U.S. Cl. ............................ 250/491.1; 250/492.21; 250/492.22; 250/492.3

(58) Field of Classification Search .... 250/491.1–492.3
See application file for complete search history.

(56) References Cited

U.S. PATENT DOCUMENTS 6,630,681 B1 * 10/2003 Kojima ................. 250/492.22
6,809,319 B2   10/2004 Sohda et al.
6,835,511 B2 * 12/2004 Hirayanagi ................. 430/22
2002/0192598 A1 * 12/2002 Hirayanagi ................ 430/311

FOREIGN PATENT DOCUMENTS

JP   2004-071690   8/2002
JP   2004-214435   1/2003

OTHER PUBLICATIONS

Y. Sakitani et al., "Electron-Beam Cell-Projection Lithography System", J. Vac. Sci. Technol. B., vol. 10, No. 6 (Nov./Dec. 1992), pp. 2759-2763.
Kazumi Iwadate et al., "A Novel-High-Speed Nanometric Electron Beam Lithography System: EB-F", J. Vac. Sci. Technol. B., vol. 5, No. 1 (Jan./Feb. 1987), pp. 75-78.

* cited by examiner

*Primary Examiner*—Jack I. Berman
*Assistant Examiner*—Andrew Smyth
(74) *Attorney, Agent, or Firm*—Reed Smith LLP; Stanley P. Fisher, Esq.; Juan Carlos A. Marquez, Esq.

(57) ABSTRACT

An electron beam writing technology which enables highly accurate deflection correction of a minute field used in an electron beam writing system is provided. In this system, a function to move an electron beam by a deflection means through high-speed deflection scanning so as to repeat formation of a cyclic patterned electron beam and a function to move the patterned electron beam on cyclic correction marks by the deflection means through low-speed deflection scanning in synchronization with one cycle of the repetition are provided, and reflected electrons or secondary electrons emitted from the correction marks and the vicinity thereof or transmitted electrons transmitted through the correction marks in the low-speed deflection scanning are detected so as to correct the position or deflection amount of the electron beam based on the detection result.

12 Claims, 12 Drawing Sheets

BEAM DEFLECTION POSITION

ELECTRON BEAM WRITING SYSTEM AND ELECTRON BEAM WRITING METHOD

CROSS-REFERENCE TO RELATED APPLICATION

The present application claims priority from Japanese Patent Application No. JP 2005-055592 filed on Mar. 1, 2005, the content of which is hereby incorporated by reference into this application.

TECHNICAL FIELD OF THE INVENTION

The present invention relates to an electron beam writing technology used in the manufacturing process of a semiconductor integrated circuit and the like. More particularly, it relates to a technology effectively applied to a high-precision electron beam writing system and writing method.

BACKGROUND OF THE INVENTION

For example, in the field of an electron beam writing technology, the inventors of the present invention have studied the following technologies.

In a conventional electron beam writing system, the size of a deflection field (region) on a sample which is scanned the fastest by a deflector has been about 50 µm square (see, for example, Sakitani et al. "Journal of Vacuum and Technology" 1992, B12, pp. 2759 to 2763 (non-patent document 1)).

Also, in order to accurately deflect the 50-µm-square region, deflection is corrected. More specifically, an electron beam is deflected to a position near a corner of the deflection field to detect a mark for correction near it, thereby measuring and correcting the difference between a desired deflection amount and the actually measured deflection amount.

The electron beam writing system having a micro deflection field of about 2 µm square has been proposed recently (see, for example, Iwadate et al. "Journal of Vacuum and Technology" 1987, B5, pp. 75 to 78 (non-patent document 2).

SUMMARY OF THE INVENTION

Incidentally, the inventors of the present invention have studied the above-described electron beam writing technologies. As a result, the following facts have been found.

As a reliable method for making electron beam writing system faster, there is a multi beam method. In this method, a plurality of electron beams which are two-dimensionally arranged at a predetermined pitch are used. Therefore, the distance between the electron beams is short, and the fastest deflection field is about 2 µm square.

In the above-described conventional deflection correction method of 50 µm square, since scanning of 2 µm or more is performed for the mark detection itself, the conventional method cannot be applied to 2-µm-square fields. Moreover, in the above-described technologies, a method for correcting deflection in such a minute deflection field is not mentioned (see non-patent document 1 and non-patent document 2).

In order to solve this problem, as a method for correcting deflection in a minute deflection field, Japanese Patent Application Laid-Open Publication No. 2004-214435 discloses a method. In this method, a function to scan a sample while deflecting an electron beam at at least two different deflection speeds, a function to repeat formation of a patterned electron beam by high-speed scanning, and a function to move the electron beam over a dotted mark for correction in a low-speed scanning are provided, in which reflected electrons, secondary electrons, or transmitted electrons from the scanned correction mark and the vicinity thereof are detected, and the position, the deflection amount, or the blanking time of the electron beam is corrected based on the detection result. However, in this method, deflection distortion within the patterned electron beam formed by the high-speed scanning cannot be detected and corrected, and the size of the opening of the mark has to be reduced in order to improve the accuracy also in the beam deflection correction. Therefore, the signal amount is reduced due to the reduction of the secondary electrons or the transmitted electrons. As a result, the accuracy is degraded in this method.

Thus, an object of the present invention is to provide an electron beam writing technology which enables precise correction of deflection in a minute field in an electron beam writing system.

The above and other objects and novel characteristics of the present invention will be apparent from the description of this specification and the accompanying drawings.

In order to achieve the above-described object, in the present invention, a function to scan a sample while deflecting an electron beam at at least two different deflection speeds, a function to repeat formation of a cyclic patterned electron beam in high-speed scanning of the electron beam, a function to move the beam on a correction mark including a cyclic pattern in a low-speed scanning in synchronization with the above-described step are provided, in which reflected electrons, secondary electrons or transmitted electrons emitted from the scanned correction mark and the vicinity thereof are detected, and the position, deflection amount, or blanking time of the electron beam is corrected based on the detection result.

A method according to the present invention is particularly suitable for a multi-beam electron beam writing system, and it is effective to perform the correction by use of a plurality of electron beams. For example, in this method, a function to form a patterned electron beam in which adjacent electron beams are in parallel to each other and have the same cycle and a function to analyze the detection result obtained from a correction mark including cyclic patterns are provided.

Typical configuration examples of the present invention will be described below.

(1) An electron beam writing system according to the present invention comprises: an electron source; an electron-optical system for irradiating an electron beam emitted from the electron source onto a sample via deflection means having at least two different deflection speeds and an objective lens so as to scan the sample, thereby forming a desired pattern on the sample; a stage on which the sample is mounted; a correction mark provided on the stage; an electron detector for detecting a reflected electron, a secondary electron, or a transmitted electron obtained by the irradiation of the electron beam; a function to move the electron beam through high-speed scanning by the deflection means so as to repeat formation of a cyclic patterned electron beam; a function to move the electron beam on the cyclic correction mark through low-speed scanning by the deflection means in synchronization with one cycle of the repetition; and a function to detect a reflected electron or a secondary electron emitted from the correction mark and the vicinity thereof or a transmitted electron transmitted through the correction mark by the low-speed scanning so as to correct a position, deflection amount, or blanking time of the electron beam based on the detection result.

(2) An electron beam writing system according to the present invention comprises: an electron-optical system for irradiating a plurality of electron beams arranged at a predetermined interval onto a sample via deflection means having a plurality of deflectors having at least two different deflection speeds and an objective lens so as to scan the sample, thereby forming a desired pattern on the sample; a stage on which the sample is mounted; a correction mark provided on the stage; and an electron detector for detecting a reflected electron, a secondary electron, or a transmitted electron obtained by the irradiation of the electron beam, wherein the deflection means has a first deflector for high-speed scanning and a second deflector for low-speed scanning, and the plurality of electron beams are moved in parallel in the high-speed scanning by the first deflector to form a cyclic patterned electron beam, the plurality of electron beams are moved in parallel on the cyclic correction mark in the low-speed scanning by the second deflector in synchronization with the formation of the patterned electron beam, a reflected electron or a secondary electron emitted from the correction mark and the vicinity thereof or a transmitted electron transmitted through the correction mark in the low-speed scanning is detected, and the position, deflection amount, or deflection distortion of the electron beam is corrected based on the detection result.

(3) An electron beam writing method according to the present invention comprises: a step of irradiating an electron beam emitted from an electron source onto a sample via an electron-optical system having deflection means having at least two different deflection speeds and an objective lens so as to form a desired pattern on the sample; a step of performing a high-speed scanning of the electron beam by using the deflection means so as to repeat formation of a cyclic patterned electron beam; a step of, in synchronization with one cycle of the repetition, performing a low-speed scanning of the electron beam on a cyclic correction mark provided on a stage on which the sample is mounted by the deflection means; a step of detecting a reflected electron or a secondary electron emitted from the correction mark and the vicinity thereof or a transmitted electron transmitted through the correction mark in the low-speed scanning; and a step of correcting the position, deflection amount, or deflection distortion of the electron beam based on the detection result.

The effects obtained by typical aspects of the present invention will be briefly described below.

According to the present invention, it is possible to realize an electron beam writing system and a writing method which enable highly accurate correction of the deflection amount of a minute field and the deflection distortion in the minute field in an electron beam writing system.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
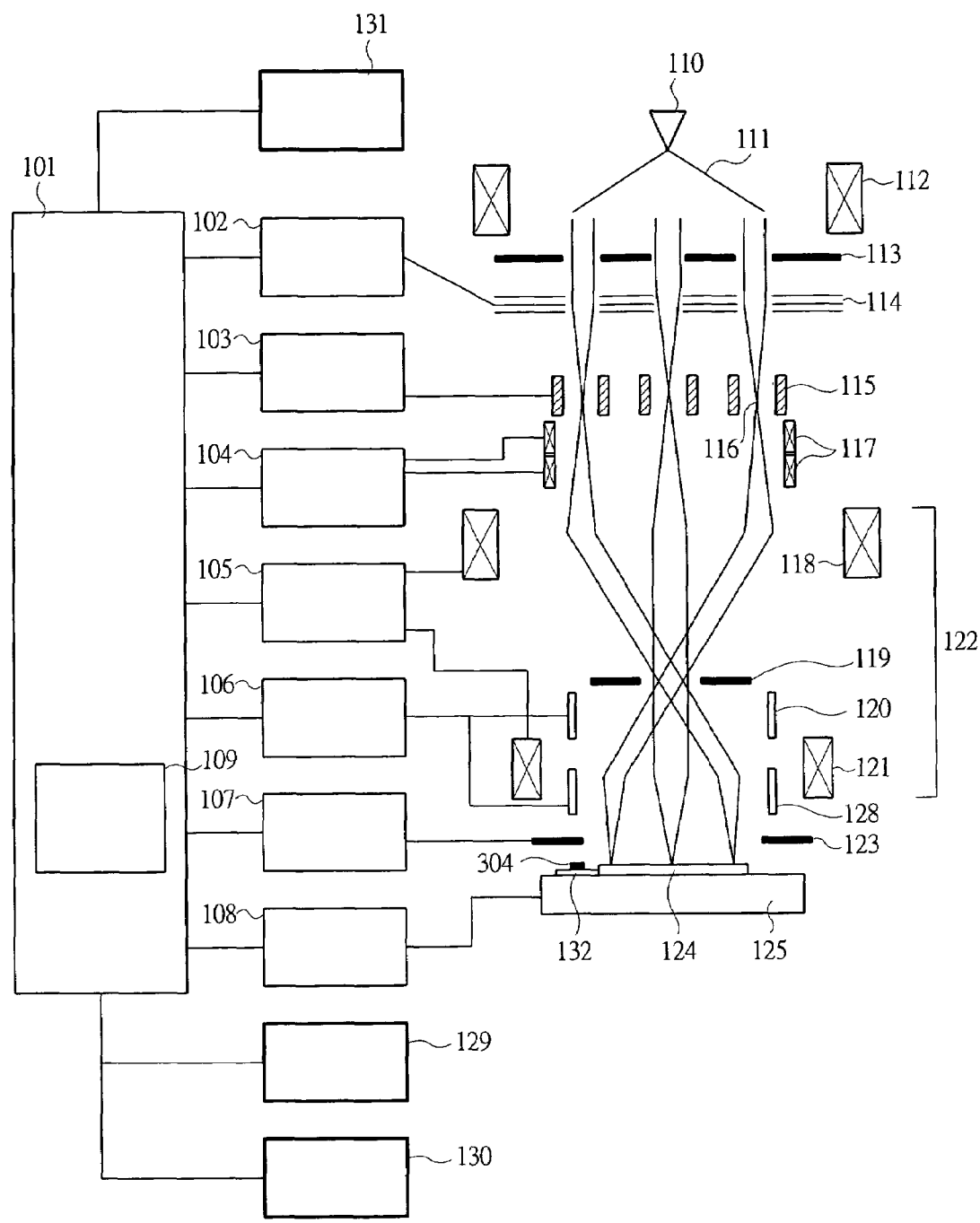
FIG. 1 is a diagram showing a configuration of an electron beam writing system according to first to third embodiments of the present invention.
Figure 16:
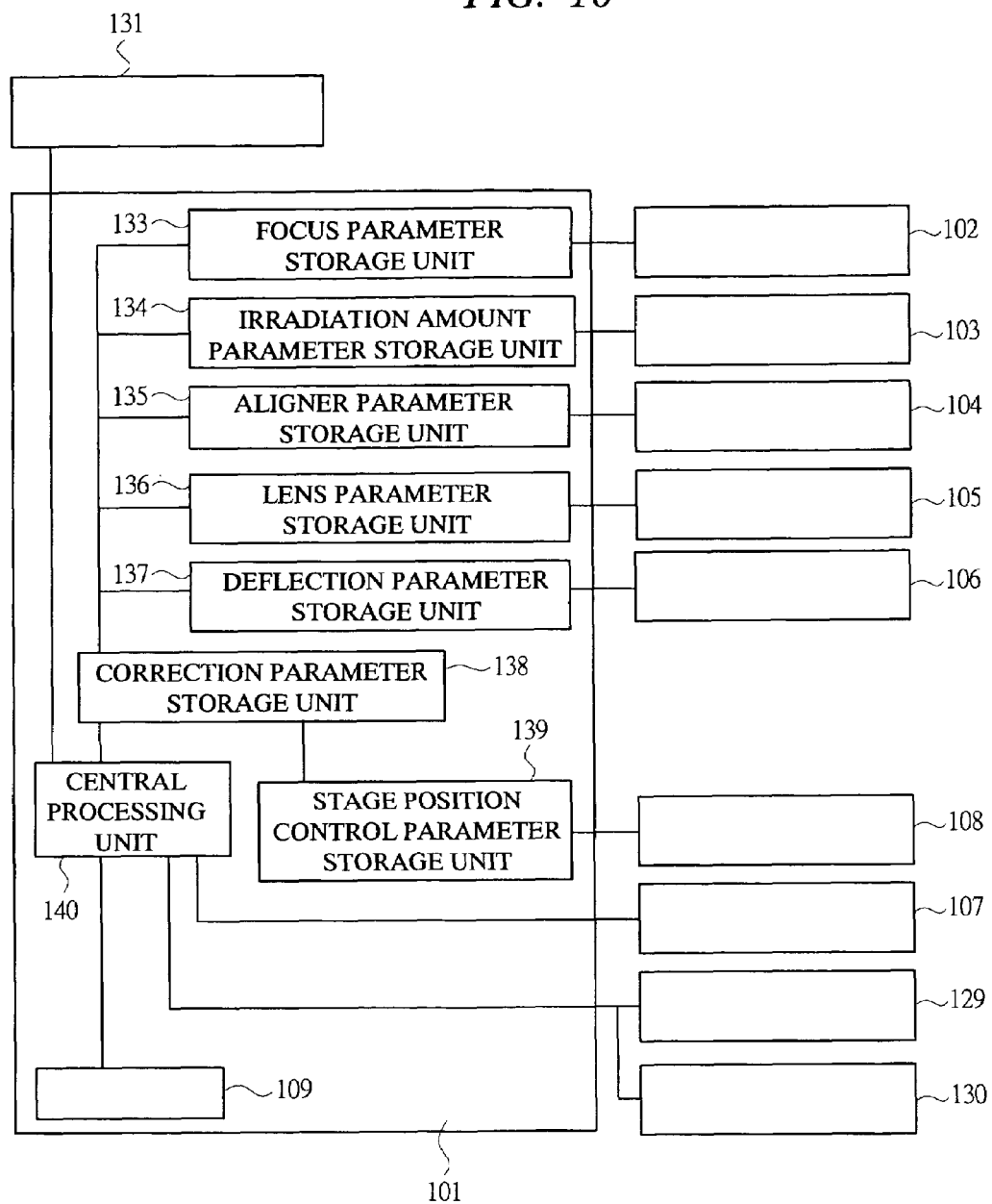
FIG. 16 is a diagram showing the detailed configuration of a central control unit in the electron beam writing system according to the first to third embodiments of the present invention.

FIG. 1 is a diagram showing a configuration of an electron beam writing system according to an embodiment of the present invention, and FIG. 16 is a block diagram showing a detailed configuration of a central control unit in the electron beam writing system according to this embodiment.

First, an example of the configuration of the electron beam writing system according to this embodiment will be described with reference to FIG. 1 and FIG. 16. The electron beam writing system of this embodiment is comprised of: for example, an electron optical system including an electron gun 110, a condenser lens 112, an aperture array 113, a lens array 114, a blanker array 115, aligners 117, a first projector lens 118, a blanking aperture 119, a first deflector 120, a second projector lens 121, a second deflector 128, and others; a control system including a central control unit 101, a focus control circuit 102, a blanking circuit 103, an aligner control circuit 104, a lens control circuit 105, a deflection control circuit 106, a signal processing circuit 107, a stage control circuit 108, a waveform storage unit 129, a waveform analysis unit 130, a writing pattern data generation unit 131, and others; an electron detector 123; a stage 125; a silicon substrate 304; a transmitted electron detector 132; and others.

Also, the central control unit 101 is comprised of a focus parameter storage unit 133, an irradiation amount parameter storage unit 134, an aligner parameter storage unit 135, a lens parameter storage unit 136, a deflection parameter storage unit 137, a correction parameter storage unit 138, a stage position control parameter storage unit 139, a central processing unit 140, a display device 109, and others.

As shown in FIG. 1, an electron beam 111 emitted from the electron gun (electron source) 110 passes through the condenser lens 112 so as to be parallel beams and divided into a plurality of point beams by the aperture array 113 having a plurality of apertures. Then, the lens array 114 at the subsequent stage forms intermediate images 116 of the point beams. The blanker array 115 and the blanking aperture 119 are provided so that the plurality of point beams can be individually turned on/off.

The multi point beams which are formed in the above-described manner are condensed by a doublet lens 122 comprised of the first projector lens 118 and the second projector lens 121, and an image is formed on a sample 124.

The first deflector 120 for high speed and the second deflector 128 for low speed are provided between the object plane and the image plane of the doublet lens 122 to define the writing position on the sample 124. The silicon substrate 304 including correction marks 306 for detecting the position of an electron beam is provided on the stage 125. The position of an electron beam can be measured by using a laser interferometer (not shown) for measuring the position of the stage 125 and the reflected electron detector 123. Note that, in this embodiment, in addition to the electron detector for detecting reflected electrons or secondary electrons from the correction marks 306, which is used to measure the position of the electron beam, the transmitted electron detector 132 for detecting the electrons which pass through opening marks is also provided.

Also, the aligners 117 are provided in a two-stage structure above the first projector lens 118 which is the first lens of the doublet lens 122, and the incident angle and the incident position of an electron beam with respect to the lens can be adjusted by operating the aligners in conjunction with each other. The aligners 117 are driven by the aligner control circuit 104, and the doublet lens 122 is driven by the lens control circuit 105. Specifically, electric currents are supplied thereto in this embodiment. The set values of the electric currents are determined based on information given from the central control unit 101. Similarly, the focus control circuit 102 and the blanking circuit 103 operate the corresponding optical devices by supplying voltages thereto. The set values thereof are also determined based on information given from the central control unit 101. The central control unit 101 also performs calculation for determining the operating amounts of the lenses and the aligners by utilizing information obtained from the signal processing circuit 107 and the stage control circuit 108.

Also, the electron beam writing system according to this embodiment has the display device 109 having a screen in which setting of change in excitation, display of the amount of change in the electron beam position, and resetting of the aligners and lens excitation (amount of current) are performed by utilizing the above-described functions. When performing the writing, the electron beam 111 is controlled by the central control unit 101 based on control signals from the writing pattern data generation unit 131, and the pattern is written on the sample 124.

As shown in FIG. 16, in the central control unit 101, the central processing unit 140 receives writing pattern data from the writing pattern data generation unit 131, and controls the control circuits (102 to 106, 108) by distributing signals thereto through the parameter storage units (133 to 137, 139).

Also, by utilizing the information obtained from the signal processing circuit 107, the stage control circuit 108, the waveform storage unit 129, and the waveform analysis unit 130, the central processing unit 140 also performs calculation for determining the correction amount of the operation of the lenses, aligners, deflectors, and blanking. The correction values thereof are stored in the correction parameter storage unit 138, and writing is carried out with reference to the correction parameters.

Figure 2:
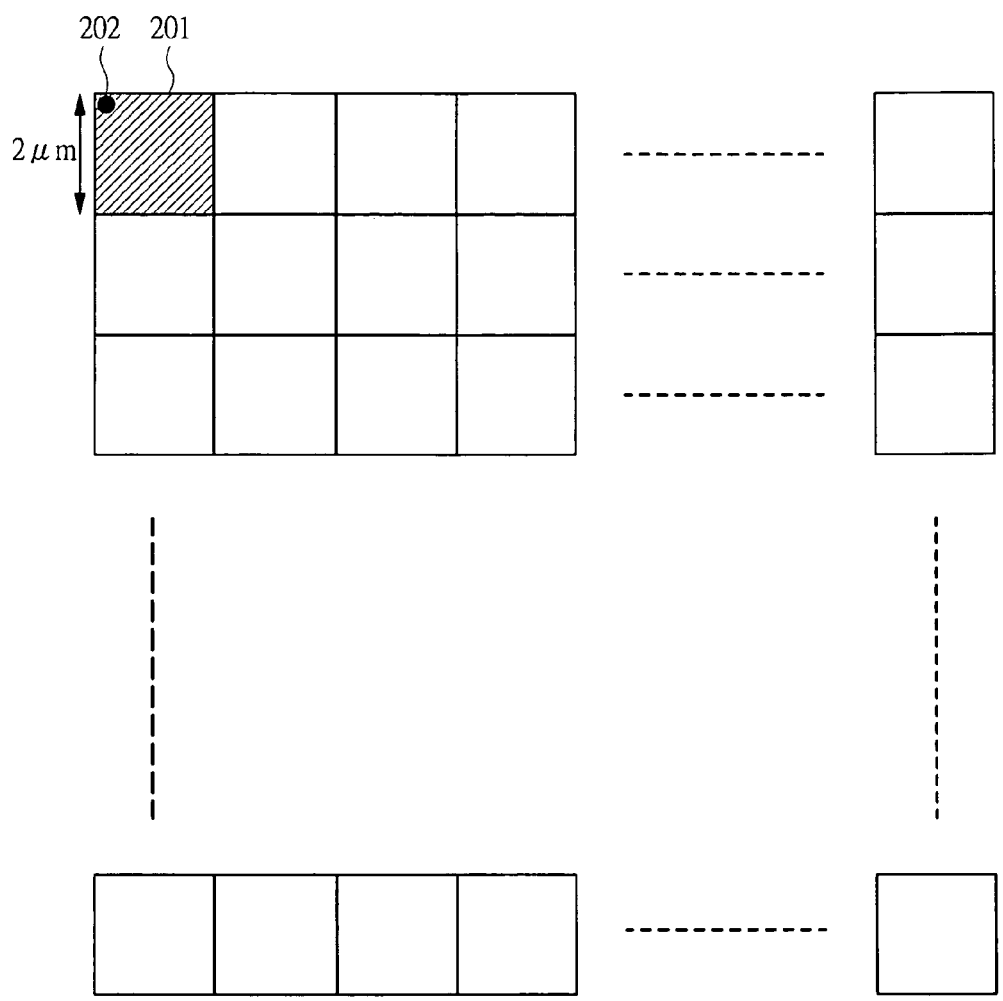
FIG. 2 is a diagram for describing a minute field on which deflection correction is to be performed in the electron beam writing system according to the first to third embodiments of the present invention.

FIG. 2 is an explanatory diagram showing a minute field for the deflection correction in the electron beam writing system according to this embodiment.

As shown in FIG. 2, the interval between multi electron beams 202 on the surface of the sample is 2 μm in this embodiment. Therefore, each of the electron beams 202 is required to perform the writing in a minute field 201 of 2 μm square. In this writing method, a pattern is formed by controlling on/off of the electron beam 202 during the writing in a 2 μm square. In order to improve the throughput, since deflection scanning has to be performed at high speed in the minute field 201, dedicated deflectors are used for the scanning. The following means is used for correcting the deflection of the 2 μm square.

Figure 3:
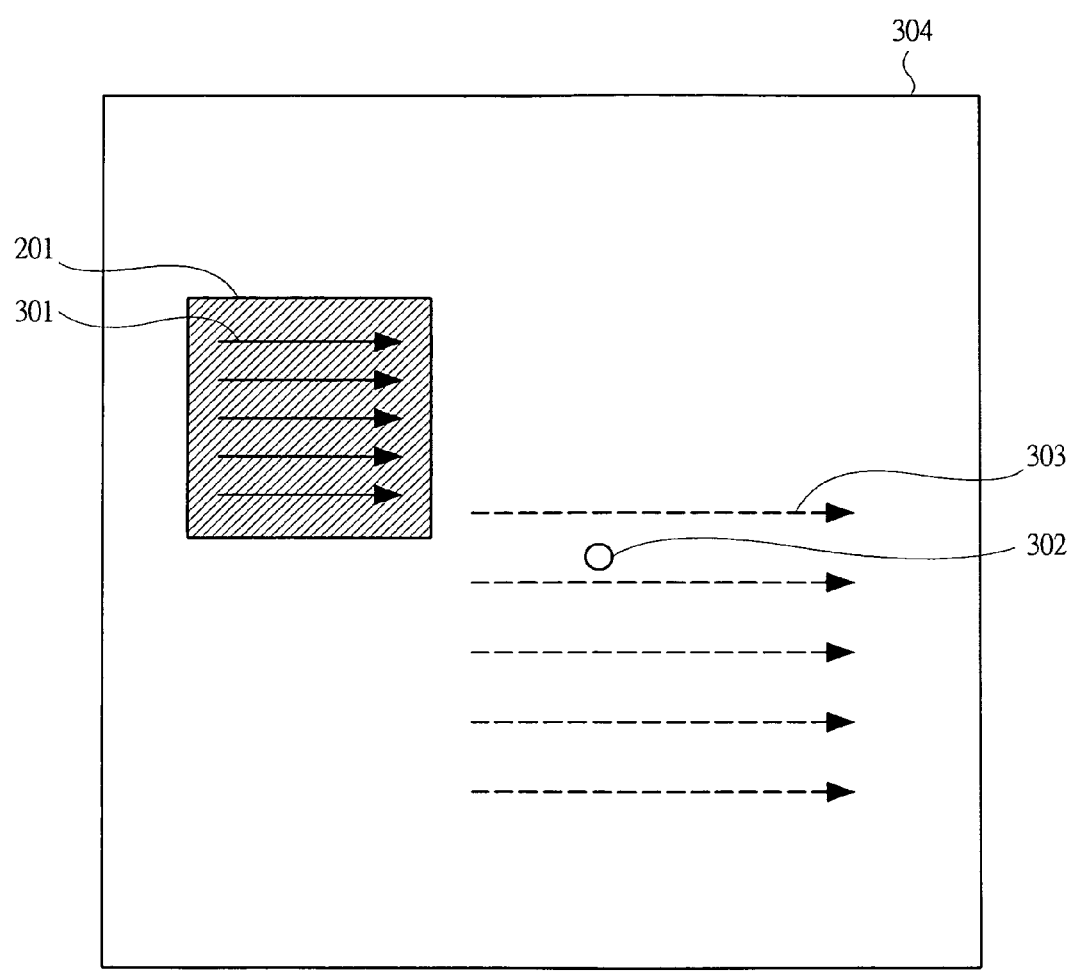
FIG. 3 is a diagram for describing a scanning method in a conventional correction method according to a prior technology of the present invention.

In order to facilitate the understanding of characteristics of the present invention, the present invention will be described in comparison with a prior technology of the present invention. FIG. 3 shows a scanning method of a conventional correction method as a prior technology of the present invention. As shown in FIG. 3, first, high-speed deflection scanning 301 is performed on the entire surface of the minute field 201. This process of two-dimensional scanning is repeated. In association (synchronization) with one process (one cycle) of this scanning process, low-speed deflection scanning 303 is performed on a circular correction mark 302 with a diameter of 0.1 μm formed on the silicon substrate 304 provided on the stage 125. When one cycle of the high-speed deflection scanning 301 is integrated, it is equivalent to a 2-μm-square electron beam. The degree of the deflection amount can be obtained by obtaining the precise size of the 2-μm-square electron beam. The smaller the correction mark 302, the more accurate the deflection amount becomes. However, the smaller the mark, the less the number of measured reflected electrons and transmitted electrons becomes, and the accuracy is degraded. Thus, the minimum size is a diameter of 0.1 μm. Even in the case of the diameter of 0.1 μm, since reflected or transmitted electron signals with respect to a beam current of 0.2% or less of the 2-μm-square electron beam are measured, the measurement accuracy of the deflection amount is probably about 5 nm. In this method, since the distortion amount in the 2-μm-square electron beam cannot be measured, it is difficult to correct the distortion of the pattern position in the 2 μm square in the actual writing.

Figure 4:
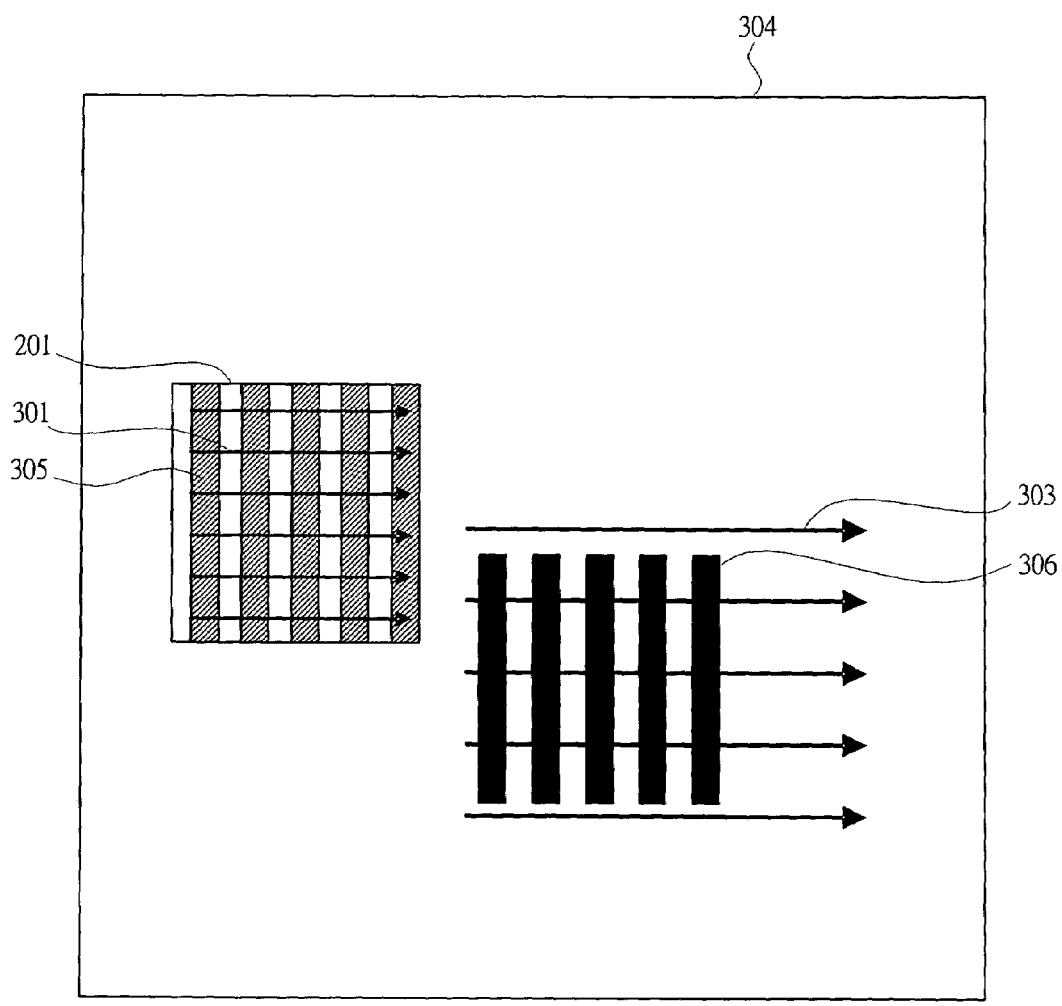
FIG. 4 is a diagram showing a scanning method according to the first embodiment of the present invention.

Meanwhile, a correction method according to the present invention is shown in FIG. 4. First, the high-speed deflection scanning 301 is performed in the minute field 201 so as to form diffraction-grating-shaped patterned electron beams 305 of a constant cycle. The process of this two-dimensional scanning is repeated. In association (synchronization) with one process (one cycle) of this scanning process, the low-speed deflection scanning 303 is performed on correction marks 306 having the same cycle as the patterned electron beams 305, which are formed on the silicon substrate 304 provided on the stage 125. When one cycle of the high-speed deflection scanning 301 is integrated, it is equivalent to the diffraction-grating-shaped 2-μm-square patterned electron beams 305. Note that, in this embodiment, the correction marks 306 are formed of rectangular openings. However, they are not limited thereto, and may be a pattern of a metal or the like.

When the patterned electron beams 305 and the correction marks 306 are completely matched with each other in terms of the waveform of transmitted electrons which is obtained by the low-speed deflection scanning of the 2-μm-square diffraction-grating-shaped patterned electron beams 305 on the correction marks 306 having the same cycle, measurement of reflected or transmitted electron signals with respect to a beam current of 50% of the 2-μm-square electron beam is performed. Therefore, a signal amount of 200 times or more of the conventional correction mark 302 with a diameter of 0.1 μm shown in FIG. 3 can be expected. The waveform as shown in FIG. 5 is obtained as the waveform of transmitted electrons by the transmitted electron detector 132, which is obtained in the deflection at a position where the center of the diffraction-grating-shaped patterned electron beams 305 and the center of the correction marks 306 are matched with each other.

Figure 5:
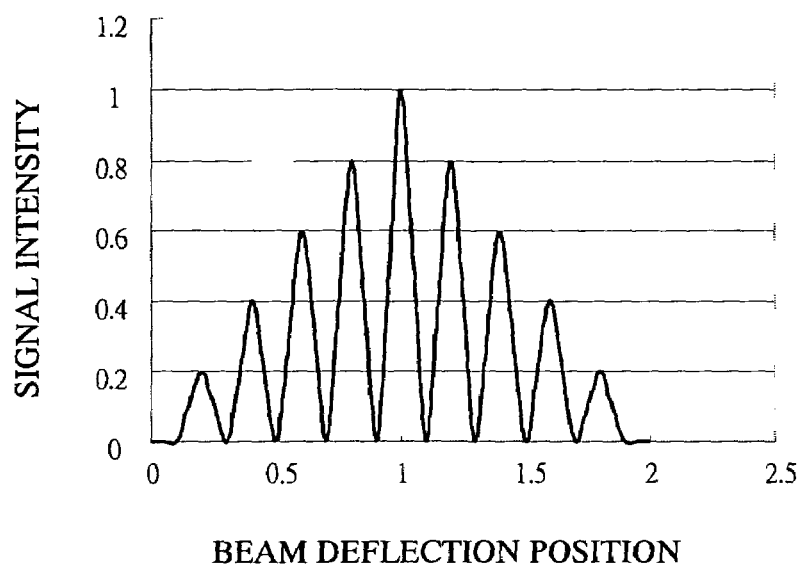
FIG. 5 is a diagram showing the signal waveform obtained from a proper beam deflection amount in the first and second embodiments of the present invention.

FIG. 5 is a diagram showing a signal waveform which is obtained from an appropriate beam deflection amount. In FIG. 5, the horizontal axis represents beam deflection positions in the case where the low-speed deflection scanning is performed on the correction marks 306, and the vertical axis represents the intensity of the signals which are detected by the transmitted electron detector 132 in the scanning.

In this embodiment, the correction marks 306 include five rectangular openings each of which has a width of 0.2 μm and a height of 2 μm, and the openings are arranged with a pitch of 0.4 μm and prepared on the silicon substrate 304 with a thickness of 2 μm. When forming the pattern of the correction marks 306, an electron beam batch pattern irradiation method is employed, and therefore, the accuracy within 0.01 μm can be obtained for both the opening dimensional accuracy and position accuracy.

Figure 15:
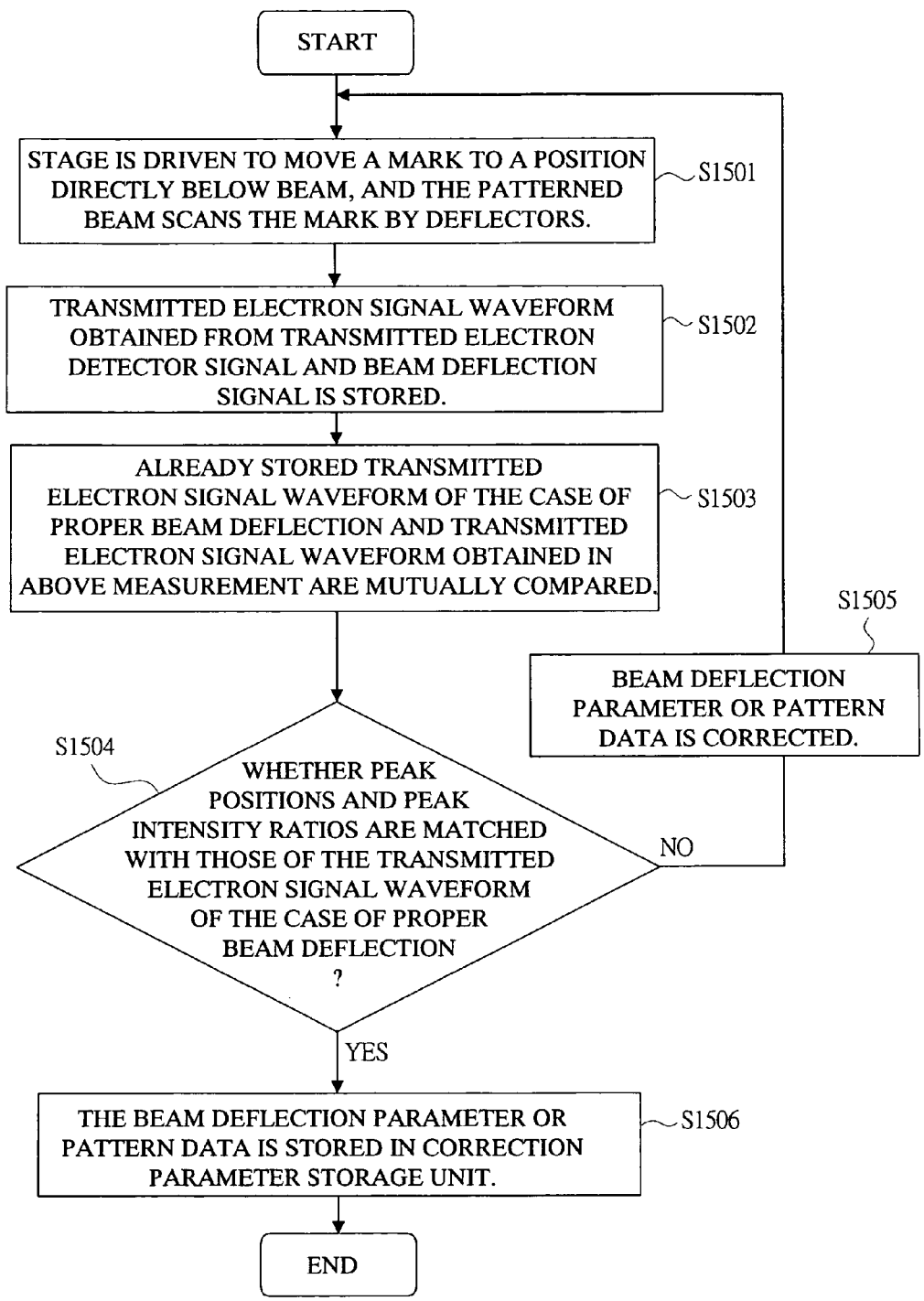
FIG. 15 is a flow chart showing a correction flow in the electron beam writing system according to the first to third embodiments of the present invention.

Next, a method of deflection correction performed by using the marks will be described with reference to FIG. 15. FIG. 15 shows the flow of a correction procedure. First, in step S1501, the stage 125 is driven to move the correction marks 306 to a position directly below the electron beam, and the patterned electron beams 305 are caused to scan the correction marks 306 by the first deflector 120 and the second deflector 128.

In step S1502, a transmitted electron signal waveform obtained from detection signals of the transmitted electron detector 132 and beam deflection signals is stored in the waveform storage unit 129.

In step S1503, the already stored transmitted electron signal waveform (corresponding to FIG. 5) of appropriate beam deflection and the transmitted electron signal waveform obtained in the above-described measurement are compared with each other in the waveform analysis unit 130.

In step S1504, it is checked whether the peak positions and peak intensity ratios are matched with those of the transmitted electron signal waveform of appropriate beam deflection. If they are not matched, the process proceeds to step S1505, in which the beam deflection parameter of the deflection parameter storage unit 137 or the pattern data of the writing pattern data generation unit 131 is corrected. After the correction in step S1505, the process is returned to step S1501, and steps S1501 to S1504 are repeated. When the signal waveforms are matched in step S1504, the process proceeds to step S1506, in which the beam deflection parameter or the pattern data is stored in the correction parameter storage unit 138, and the correction is finished.

An example of deflection correction will be described below. In the above-described manner, correction is performed by use of the correction marks 306 in which five rectangular openings each having a width of 0.2 μm and a height of 2 μm are arranged at a pitch of 0.4 μm and the patterned electron beams 305 obtained by performing the high-speed deflection scanning 301 from the central control unit 101 so that five rectangular beams each having a width of 0.2 μm and a height of 2 μm are arranged at a pitch of 0.4 μm.

Figure 6:
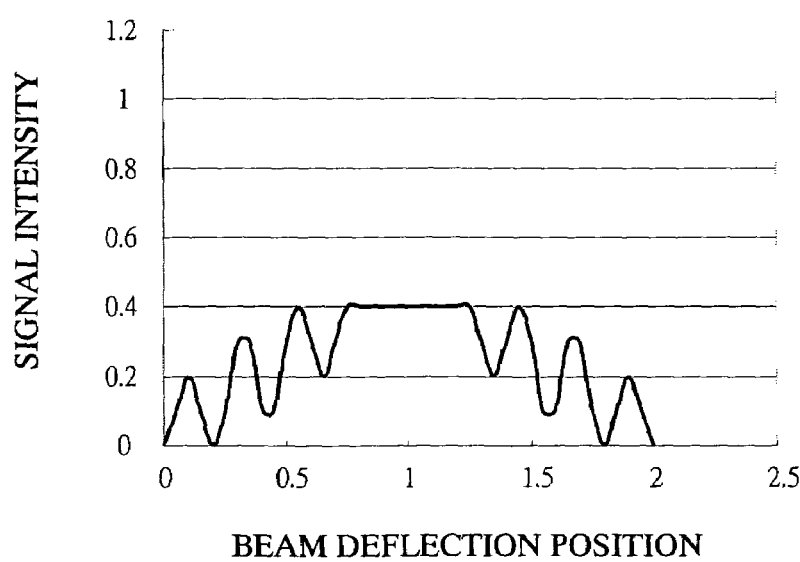
FIG. 6 is a diagram showing the signal waveform obtained from a beam deflection amount according to the first embodiment of the present invention.
Figure 8:
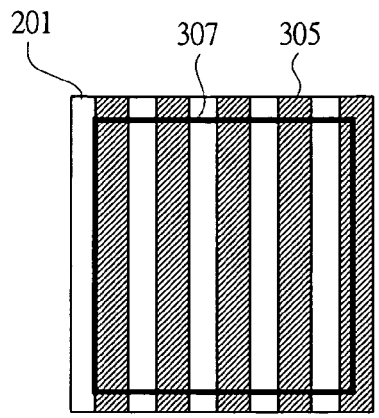
FIG. 8 is a diagram for describing a designed minute field and a measured minute field according to the first embodiment of the present invention.

First, the low-speed deflection scanning 303 is performed on the correction marks 306 formed on the silicon substrate 304 provided on the stage 125. The obtained transmitted electron signal waveform is shown in FIG. 6. This waveform is stored in the waveform storage unit 129 and is compared with the waveform (corresponding to FIG. 5) of the case where correction is properly performed, which has been stored in the waveform storage unit 129 in advance, in the waveform analysis unit 130. From the characteristics that, for example, the center peak is low, the entire waveform width is large, and peak positions are shifted from appropriate positions, it has been found that the beam deflection amount is larger by 10% with respect to the designed value of 2 μm. More specifically, as shown in FIG. 8, the minute field 201 is larger by 10% with respect to a designed minute field 307. Therefore, in accordance with the flow of the correction procedure of FIG. 15, the central processing unit 140 controls the deflection control circuit 106 via the deflection parameter storage unit 137 to perform correction so that the deflection width is reduced by 10%. Thereafter, when the above-described measurement is performed again in accordance with the flow of the correction procedure of FIG. 15, the signal waveform of FIG. 5 can be obtained. The peak positions and intensity ratios are matched with those of the appropriate signal waveform, and the lateral deflection amount accuracy of 2 nm or less can be achieved.

Figure 7:
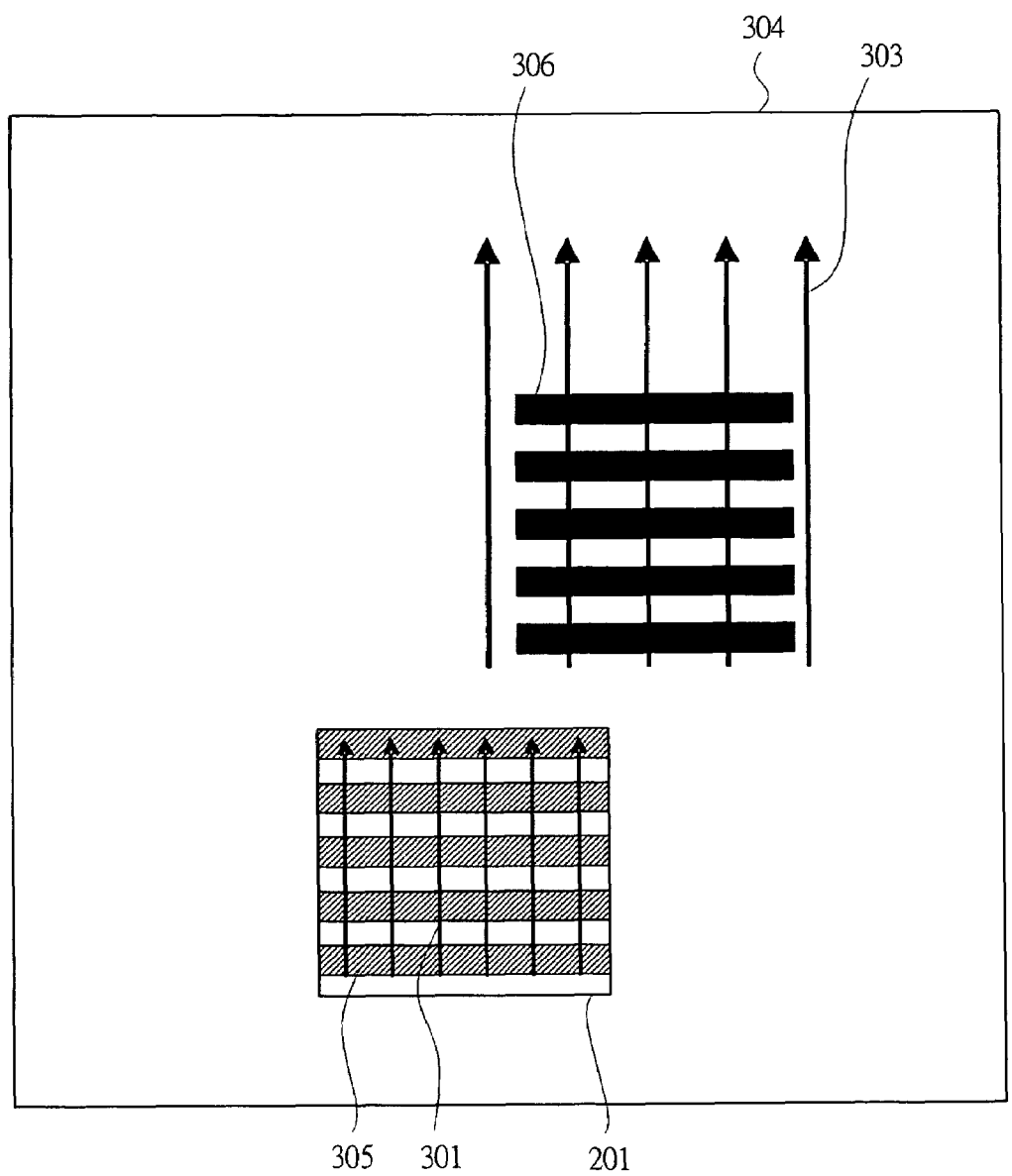
FIG. 7 is a diagram showing a scanning method according to the first embodiment of the present invention.

Similarly, vertical deflection amount correction can be also performed with similar accuracy by use of the lateral correction marks 306 shown in FIG. 7. The deflection correction parameters thereof are obtained in accordance with the flow of the correction procedure of FIG. 15, and the parameters are stored in the correction parameter storage unit 138 (FIG. 16). In this manner, according to this embodiment, based on the information of peak heights and peak positions in the signal waveform, the degree of the beam deflection amount can be measured with using more sensitive and larger transmitted electron amount than that of conventional technologies. Consequently, measurement and correction can be performed with high accuracy.

Second Embodiment

Next, the correction of deflection distortion will be described. Note that the configuration of the electron beam writing system according to a second embodiment of the present invention is same as that of the first embodiment which is shown in FIG. 1 and FIG. 16.

In conventional methods, since a distortion amount in a 2-μm-square electron beam cannot be measured, it is difficult to correct distortion of the pattern position of a 2 μm square in the actual writing.

On the other hand, correction is performed in the following manner in the present invention. First, deflection amount correction is performed in the same manner as that of the first embodiment by use of the correction marks 306 in which five rectangular openings each having a width of 0.2 μm and a height of 2 μm are arranged at a pitch of 0.4 μm and the beam obtained by performing the high-speed deflection scanning 301 so that five rectangular beams each having a width of 0.2 μm and a height of 2 μm are arranged at a pitch of 0.4 μm.

Then, the low-speed deflection scanning 303 is performed on the correction marks 306 formed on the silicon substrate 304 provided on the stage 125.

Figure 9:
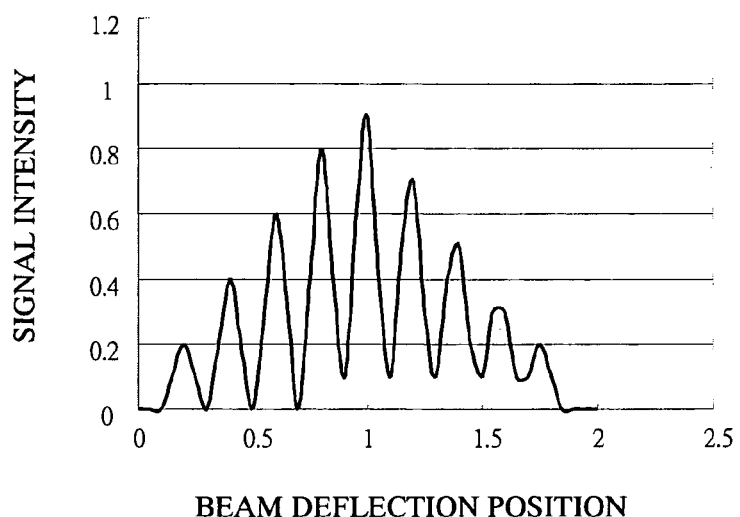
FIG. 9 is a diagram showing the signal waveform obtained from a beam deflection amount according to the second embodiment of the present invention.
Figure 10:
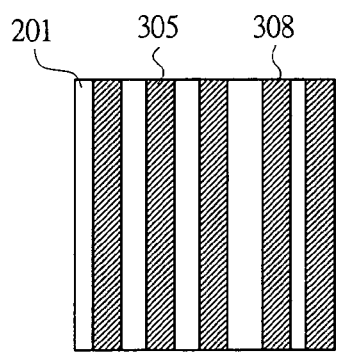
FIG. 10 is a diagram for describing a measured minute field in the second embodiment of the present invention.

The transmitted electron signal waveform thus obtained is shown in FIG. 9. This waveform is stored in the waveform storage unit 129, and is compared with the waveform of the case where correction is properly performed, which has been stored in the waveform storage unit 129 in advance, in the waveform analysis unit 130. As a result, as shown in FIG. 9, the minimum values of the peaks in the right half are increased. From the characteristics that the heights of the three peaks in the right side are lower than those of the proper waveform, it has been found that, as shown in FIG. 10, the deflection position of an electron beam 308 which is at a position 0.5 μm from the right of the 2-μm-square electron beam is shifted to the right by 0.1 μm. Methods for correcting this shift include the method in which the deflection position is corrected by the feedback to the deflection control circuit 106 in accordance with the correction procedure of FIG. 15 and the method in which the pattern position which is at the distorted beam deflection position is shifted to the right by 0.1 μm in advance in the writing pattern data generation unit 131. The correction can be performed by either method. After the correction, the above-described measurement is performed again. As a result, the signal waveform of FIG. 5 can be obtained, and the deflection distortion accuracy of 2 nm or less can be achieved.

Similarly, correction of vertical deflection distortion can be also performed with similar accuracy by use of the lateral marks shown in FIG. 7. The deflection correction parameters thereof are obtained in accordance with the flow of the correction procedure of FIG. 15, and the parameters are stored in the correction parameter storage unit 138 (FIG. 16). In this manner, in the present invention, based on the information of peak heights and peak positions in the signal waveform, the beam distortion can be measured with using a more sensitive and larger transmitted electron amount, which has been impossible in the conventional technologies. Consequently, measurement and correction can be performed with high accuracy.

Third Embodiment

In a third embodiment of the present invention, multi-beams comprised of a plurality of electron beams are used. Note that the configuration of the electron beam writing system according to the third embodiment is the same as that of the first embodiment shown in FIG. 1 and FIG. 16.

Figure 11:
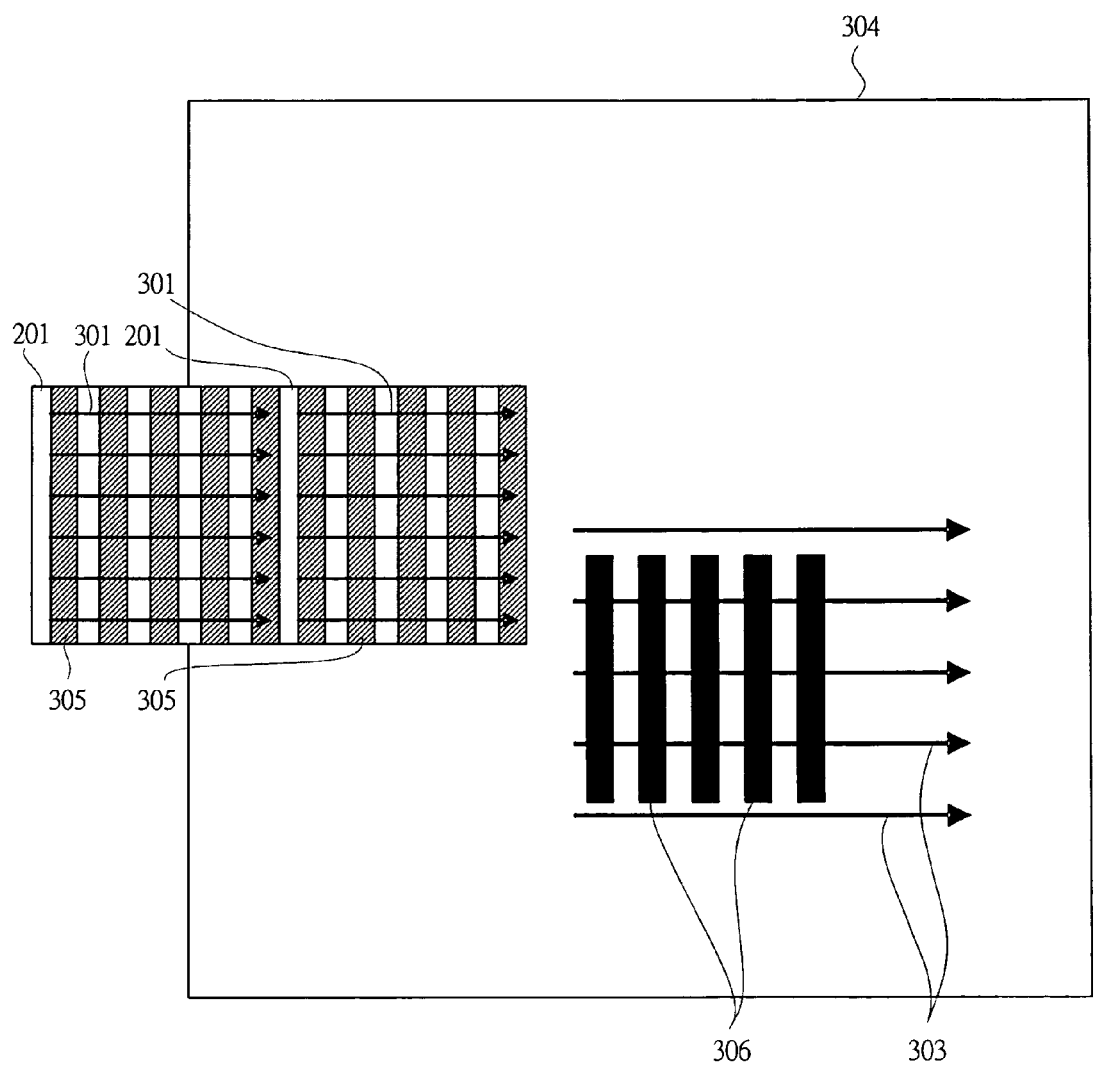
FIG. 11 is a diagram showing a scanning method according to the third embodiment of the present invention.

FIG. 11 is a diagram showing a scanning method according to the third embodiment. In FIG. 11, the central control unit 101 performs the high-speed deflection scanning 301 on the entire surface of the minute fields 201 so that adjacent multi-beams form five rectangular patterned electron beams 305 each having a width of 0.2 μm and a height of 2 μm, which are arranged at a pitch of 0.4 μm. Consequently, as shown in FIG. 11, the patterned electron beams 305 of about 2 μm×4 μm are formed in one cycle of the high-speed deflection scanning. The patterned electron beams 305 are used to perform the low-speed deflection scanning 303 on the correction marks 306 in which five rectangular opening correction marks 306 each having a width of 0.2 μm and a height of 2 μm are arranged at a pitch of 0.4 μm.

Note that, in this case, correction of the first embodiment and the second embodiment is performed in advance for each of the beams. If there is no error in the configuration of the minute fields 201 and the distances between the multi-beams are normal, the signal waveform of FIG. 12 can be obtained.

Figure 13:
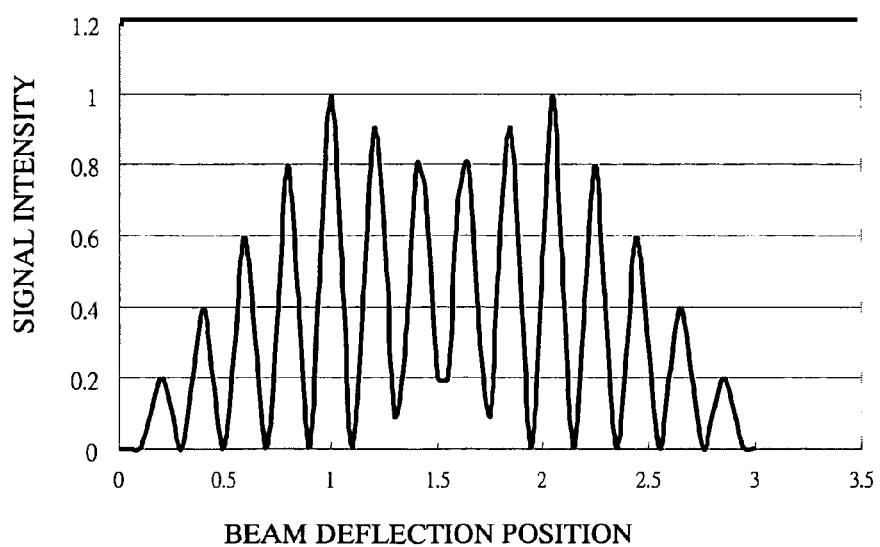
FIG. 13 is a diagram showing the signal waveform obtained from a beam deflection amount according to the third embodiment of the present invention.
Figure 14:
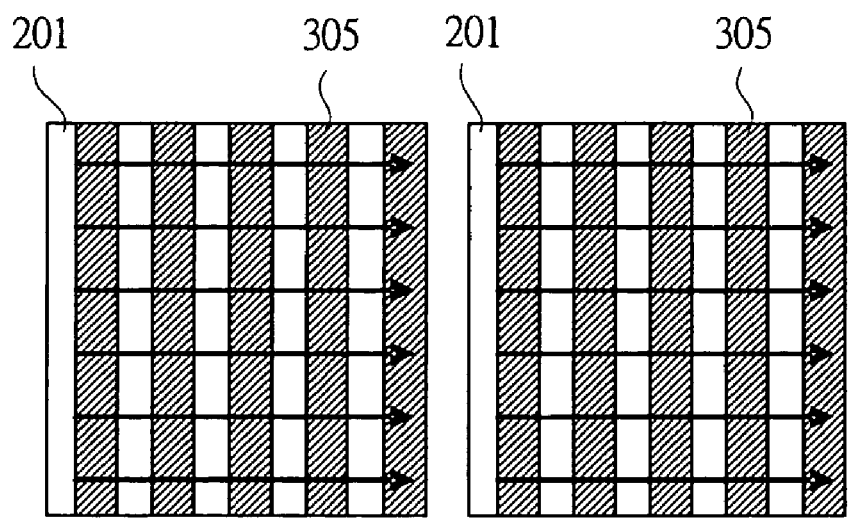
FIG. 14 is a diagram for describing a measured beam interval in the third embodiment of the present invention.

For example, it is assumed that the actually obtained signal waveform is as that shown in FIG. 13. The signal waveform of FIG. 13 is stored in the waveform storage unit 129 and is compared with the waveform of the case where correction has been properly performed, which has been stored in the waveform storage unit 129, in the waveform analysis unit 130. Then, from the characteristics that the peak heights near the center of the waveform are concaved and that the peak positions in the right half of the entire waveform are shifted, it has been found out that, in the actual patterned electron beams 305, the distance between the two multi-beams are misaligned from the designed value by about 0.1 μm as shown in FIG. 14.

Figure 12:
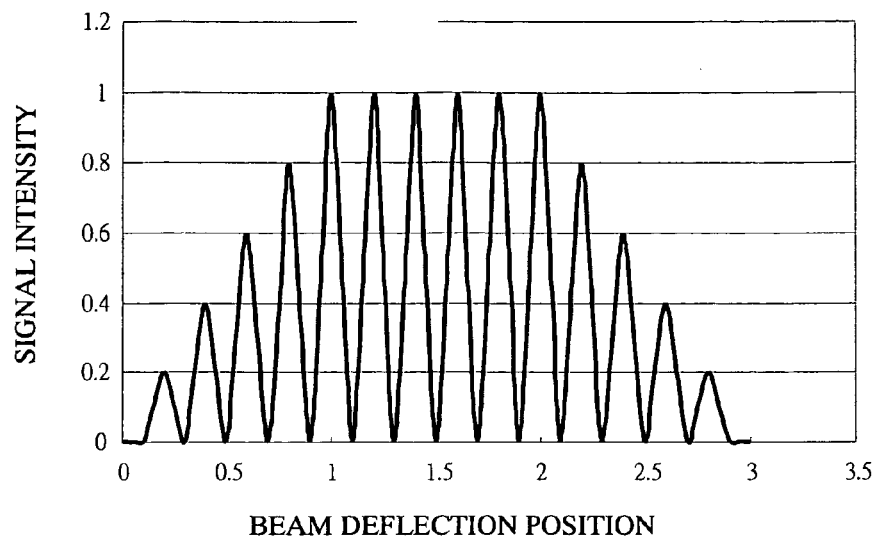
FIG. 12 is a diagram showing the signal waveform obtained from a proper beam interval in the third embodiment of the present invention.

By performing the correction to the aligner control circuit 104 via the aligner parameter storage unit 135 from the central processing unit 140 (FIG. 16), the distance between the two multi-beams are corrected, and the above-described measurement is performed again. As a result, the signal waveform of FIG. 12 is obtained, and the beam arrangement accuracy of 2 nm or less can be achieved. In the above-described manner, the aligner parameters are stored in the correction parameter storage unit 138 (FIG. 16) in accordance with the flow of the correction procedure of FIG. 15.

Measurement by use of a plurality of beams (multi-beam) is important, and further, by comparing the results of individually measured plural beams, the uniformity of the multi-beam writing can be adjusted and monitored.

Therefore, as described in detail in the first to third embodiments, according to the present invention, the deflection amount of a minute field and distortion in the minute field in an electron beam writing system can be corrected with high accuracy.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the case where rectangular openings are used as the correction patterns and transmitted electrons are detected has been described in the above-described embodiments. However, the present invention is not limited thereto, and patterns of a metal or the like can be used as the correction patterns, and reflected electrons or secondary electrons can be detected instead of the transmitted electrons.

The present invention can be applied to an electron beam writing system which is used in the manufacturing process of a semiconductor integrated circuit, and others.

What is claimed is:

1. An electron beam writing system, comprising:
   an electron source;
   an electron-optical system for irradiating an electron beam emitted from said electron source onto a sample via deflection means having at least two different deflection speeds and an objective lens so as to scan the sample, thereby forming a desired pattern on said sample;
   a stage on which said sample is mounted;
   a correction mark provided on said stage;
   an electron detector for detecting a reflected electron, a secondary electron, or a transmitted electron obtained by the irradiation of said electron beam;
   a function to move said electron beam through high-speed scanning by said deflection means so as to repeat formation of a patterned electron beam;

a function to move said electron beam on said correction mark through low-speed scanning by said deflection means in synchronization with one cycle of said repetition; and a function to detect a reflected electron or a secondary electron emitted from said correction mark and the vicinity thereof or a transmitted electron transmitted through said correction mark by said low-speed scanning so as to correct a position, deflection amount, or blanking time of said electron beam based on said detection result, wherein said patterned electron beam is formed of a plurality of separate pattern beams, said correction mark is formed of a plurality of separate pattern marks, and a data storing unit for storing a signal waveform obtained by the deflection scanning of said patterned electron beam on said correction mark and a signal analysis unit for analyzing said signal waveform are provided, and wherein said patterned electron beam is a diffraction-grating-pattern beam in which the pattern beams are arranged at a constant interval, and said correction mark is a diffraction-grating-pattern mark in which the pattern marks are arranged at the same interval as that of said diffraction-grating-pattern beam.

2. The electron beam writing system according to claim 1, wherein said correction mark is said diffraction-grating-pattern mark in which the pattern marks are arranged at the same interval in the same direction as the moving direction of said diffraction-grating-pattern beam.

3. The electron beam writing system according to claim 1, wherein said electron beam is a multi-beam formed of a plurality of electron beams arranged at a predetermined interval, and correction is performed by use of said plurality of electron beams.

4. The electron beam writing system according to claim 3, wherein adjacent electron beams of said multi-beam, which are parallel to each other, form said patterned electron beam.

5. The electron beam writing system according to claim 3, further comprising:

means for comparing detection results of said plurality of electron beams.

6. An electron beam writing method, comprising:

a step of irradiating an electron beam emitted from an electron source onto a sample via an electron-optical system having deflection means having at least two different deflection speeds and an objective lens so as to form a desired pattern on said sample;

a step of performing a high-speed scanning of said electron beam by using said deflection means so as to repeat formation of a plurality of separate patterned electron beams;

a step of, in synchronization with one cycle of said repetition, performing a low-speed scanning of said electron beam on a correction mark provided on a stage on which said sample is mounted and having a plurality of separate pattern marks with the same shape as said beam by said deflection means;

a step of detecting a reflected electron or a secondary electron emitted from said correction mark and the vicinity thereof or a transmitted electron transmitted through said correction mark in said low-speed scanning; and a step of correcting the position, deflection amount, or blanking time of said electron beam or correcting writing data position based on said detection result, wherein said patterned electron beam is a diffraction-grating-pattern beam in which the patterned beams are arranged at a constant interval, and said correction mark is a diffraction-grating-pattern mark in which the pattern marks are arranged at the same interval as that of said diffraction-grating-pattern beam.

7. The electron beam writing method according to claim 6, wherein said electron beam is a multi-beam formed of a plurality of electron beams arranged at a predetermined interval, and correction is performed by use of said plurality of electron beams.

8. The electron beam writing method according to claim 7, wherein adjacent electron beams of said multi-beam, which are parallel to each other, form said patterned electron beam.

9. The electron beam writing method according to claim 7, further comprising:

a step of comparing detection results of said plurality of electron beams.

10. An electron beam writing method, comprising:

a step of irradiating an electron beam emitted from an electron source onto a sample via an electron-optical system having deflection means having at least two different deflection speeds and an objective lens so as to form a desired pattern on said sample;

a step of performing a high-speed scanning of said electron beam by using said deflection means so as to repeat formation of a plurality of separate patterned electron beams;

a step of, in synchronization with one cycle of said repetition, performing a low-speed scanning of said electron beam on a correction mark provided on a stage on which said sample is mounted and having a plurality of separate pattern marks with the same shape as said beam by said deflection means;

a step of detecting a reflected electron or a secondary electron emitted from said correction mark and the vicinity thereof or a transmitted electron transmitted through said correction mark in said low-speed scanning; and a step of correcting the position, deflection amount, or blanking time of said electron beam or correcting writing data position based on said detection result wherein said electron beam is a multi-beam formed of a plurality of electron beams arranged at a predetermined interval, and correction is performed by use of said plurality of electron beams.

11. The electron beam writing method according to claim 10, wherein adjacent electron beams of said multi-beam, which are parallel to each other, form said patterned electron beam.

12. The electron beam writing method according to claim 10, further comprising:

a step of comparing detection results of said plurality of electron beams.

* * * * *